(12) United States Patent
Prest et al.

(10) Patent No.: US 8,014,142 B2
(45) Date of Patent: Sep. 6, 2011

(54) DISPLAY WINDOW SECURING SYSTEM

(75) Inventors: Christopher D. Prest, Mountain View, CA (US); Kyle Yeates, Palo Alto, CA (US); Michelle Yu, Oakland, CA (US)

(73) Assignee: Apple Inc., Cupertino, CA (US)

( * ) Notice: Subject to any disclaimer, the term of this patent is extended or adjusted under 35 U.S.C. 154(b) by 17 days.

(21) Appl. No.: 12/476,036

(22) Filed: Jun. 1, 2009

(65) Prior Publication Data
US 2009/0237874 A1 Sep. 24, 2009

Related U.S. Application Data

(63) Continuation of application No. 11/968,748, filed on Jan. 3, 2008, now Pat. No. 7,558,054.

(51) Int. Cl.
*H05K 5/00* (2006.01)
*H05K 7/00* (2006.01)
*G02F 1/1333* (2006.01)

(52) U.S. Cl. .................. 361/679.3; 361/679.56; 349/56; 349/58; 349/60

(58) Field of Classification Search ............. 361/679.3, 361/679.56; 349/56, 58, 60
See application file for complete search history.

(56) References Cited

U.S. PATENT DOCUMENTS

| | | | |
|---|---|---|---|
| 5,379,182 A * | 1/1995 | Fujimori et al. | 361/679.27 |
| 6,430,039 B2 | 8/2002 | Nakajima et al. | |
| 6,532,152 B1 * | 3/2003 | White et al. | 361/692 |
| 7,106,392 B2 | 9/2006 | You | |
| 7,304,837 B2 | 12/2007 | Lo et al. | |
| 2001/0002145 A1 | 5/2001 | Lee et al. | |
| 2004/0156168 A1 | 8/2004 | LeVasseur et al. | |
| 2007/0002535 A1 | 1/2007 | Kim | |

* cited by examiner

*Primary Examiner* — Lisa Lea-Edmonds
*Assistant Examiner* — Anthony M Haughton
(74) *Attorney, Agent, or Firm* — Ropes & Gray LLP; Jeffrey H. Ingerman (57) ABSTRACT

A display window assembly is mounted in the opening of a bezel of a housing, and a force is exerted against the assembly by a suitable resilient element urging it outward through the opening. The assembly may be mounted on a support or frame, from which depends one or more tabs extending inwardly of the housing. At least one of the tabs is fastened with a fastener that extends from the exterior of the housing, through a portion other than the bezel and through a surface not generally facing the user when the user is viewing the display. The advancement/withdrawal direction of the fastener is not substantially normal to the display window. However, advancement/withdrawal of the fastener causes movement of the tab, and therefore of the assembly, in an adjustment direction substantially normal to the display window to adjust the position of the display window relative to the bezel.

20 Claims, 8 Drawing Sheets

DISPLAY WINDOW SECURING SYSTEM

CROSS REFERENCE TO RELATED APPLICATION

This is a continuation of, commonly-assigned U.S. patent application Ser. No. 11/968,748, filed Jan. 3, 2008, now U.S. Pat. No. 7,558,054, which is hereby incorporated by reference herein in its entirety.

BACKGROUND OF THE INVENTION

This invention relates to an arrangement for securing a display window assembly in a housing.

There are many devices in which it may be desirable to provide a display window assembly in a housing. For example, a display screen may be provided in an electronic device, including, but not limited to, a handheld electronic device such a media player or a mobile telephone. The display screen may be touch-sensitive for user inputs, and therefore may include multiple component layers. Each layer, as well as the bonding between layers, may contribute its own thickness tolerance, and therefore they may be some tolerance in the total thickness of the display assembly.

For various reasons, it may also be desirable for the window assembly to be mounted at a predetermined position—e.g., flush, recessed a predetermined amount, etc.—relative to the surface of the housing. For aesthetic purposes, it may be desirable that there not be any visible fasteners on the bezel of the housing—i.e., on the portion of the housing surrounding the window and presented to the user. It also may be desirable that the fastener nevertheless be able to adjust the position of the window assembly relative to the bezel (e.g., to adjust for the aforementioned tolerances).

SUMMARY OF THE INVENTION

In accordance with the present invention, a display window assembly is mounted in the opening of a bezel of a housing, and a force is exerted against the assembly by a suitable resilient element—e.g., one or more springs or a compressible elastomeric material such as a closed-cell foam—urging it outward through the opening in a direction substantially normal to the display window. The assembly itself includes one or more layers—such as, for example, a display element (e.g., a liquid crystal display), a touch-sensitive layer, and a protective window layer—laminated together by, e.g., suitable adhesives or thermal bonding. The lowermost layer may be mounted on a support or frame, from which depends one or more tabs extending inwardly of the housing.

Each of the tabs may be fastened to the housing. One or more of the tabs may be fastened internally of the housing. For example, one or more tabs may have a hook that engages a suitable mating structure within the housing. However, at least one of the tabs is fastened with a fastener that extends from the exterior of the housing, through a portion other than the bezel and through a surface not generally facing the user when the user is viewing the display in normal use of the device. The advancement/ withdrawal direction of the fastener is not substantially normal to the display window (i.e., is not within 15° of normal relative to the display window). However, in order to adjust the position of the display window relative to the bezel, in a direction substantially normal to the display window (i.e., a direction that is within 15° of normal relative to the display window), the fastener causes movement of the tab, and therefore of the assembly, in the adjustment direction (i.e., the direction substantially normal to the display window.

In one embodiment, the opening in the tab may be threaded and the fastener may be a screw (or any other type of fastener whose degree of advancement and withdrawal may be controlled), and the advancement/withdrawal direction of the screw may be oblique to the adjustment direction. The force exerted by advancement or withdrawal of the screw thus includes a component in the adjustment direction, so that the position of the display window in the adjustment direction can be adjusted by advancing or withdrawing the screw. Although the force exerted by advancement or withdrawal of the screw also includes a component orthogonal to the adjustment direction, motion of the display window assembly is substantially prevented by the fastening of the other tabs to the housing.

In other embodiments, interaction of the fastener, such as a screw or a related component (as discussed below), with the opening in the tab transforms motion of the fastener in a direction other than the adjustment direction into motion of the display window assembly in the adjustment direction. For example, rather than the opening in the tab being threaded, the threaded screw-hole may be in a body mass behind the tab, and the opening in the tab may be elongated. The elongation of the opening prevents the screw from interacting with the proximal edge of the elongated opening that would exert a force in the outward direction toward the opening in the bezel, but allows the screw to interact with the distal edge of the opening to exert a force in the inward direction away from the opening in the bezel (with "proximal" and "distal" being defined relative to the display surface of the display window assembly).

In one such embodiment, the screw has a threaded shaft and a shoulder above the threaded shaft. An elastomeric mass is mounted on the threaded shaft. As the screw is tightened against the elastomeric mass, the elastomeric mass is compressed between the body mass and the shoulder, expanding in a direction radially outwardly of the shaft and contacting the distal edge of the opening in the tab, pushing the tab, and thus the display window assembly, in the adjustment direction away from the bezel, and against the force exerted by the aforementioned resilient element. As the screw is withdrawn, the display window assembly moves in the direction toward the bezel. The screw can be adjusted until the desired position of the display window assembly relative to the bezel is achieved.

In another such embodiment, the screw has a threaded shaft and a shoulder above the threaded shaft, and the distal edge of the opening in the tab is chamfered so that, as measured along the adjustment direction, the opening is larger on the side facing the direction from which the screw is inserted than it is on the side facing away from that direction. As the screw is advanced, the shoulder moves along the chamfered edge, acting as a cam follower to force the tab, and thus the display window assembly, in the adjustment direction away from the bezel, and against the force exerted by the aforementioned resilient element. As the screw is withdrawn, the display window assembly moves in the direction toward the bezel. The screw can be adjusted until the desired position of the display window assembly relative to the bezel is achieved. Alternatively, the chamfer can be on the shoulder of the screw.

In yet another such embodiment, the aforementioned body mass into which the screw is threaded may be movable along the advancement/withdrawal direction of the screw, and may have a chamfered projection or nipple that advances into the tab opening as the screw is tightened, with a similar cam action as described above adjusting the position of the display window assembly as the screw is tightened or loosened.

Although the screw or other fastener may be inserted from a side of the housing not normally visible to a user when the user is viewing the display in normal use of the device, it may nevertheless be desirable to maintain an aesthetically pleasing appearance even from those other sides. Therefore, the fastener may have an aesthetically pleasing head, such as one that matches the finish of the housing in the area of the fastener. Alternatively, because the fastener may not be flush depending on the adjustment required, the fastener can instead be countersunk into the housing, and removable decorative cap or panel can be provided that matches the housing.

Therefore, in accordance with the present invention, there is provided a device including a housing, a bezel on the housing having a display opening therein, and a display window assembly mounted adjacent the display opening and having a display surface visible in that opening. A resilient element within the housing exerts a force along an adjustment direction urging the display window assembly toward the display opening. The display window assembly has a depending tab extending in a direction away from the display surface into the housing. The device further includes a fastener extending into the housing through a fastener opening in a side facing away from the bezel. The fastener has an advancement/withdrawal direction through the tab different from the adjustment direction. Motion of the fastener along the advancement/withdrawal direction causes motion of the display window assembly toward or away from the display opening along the adjustment direction.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which.

DETAILED DESCRIPTION

Figure 1:
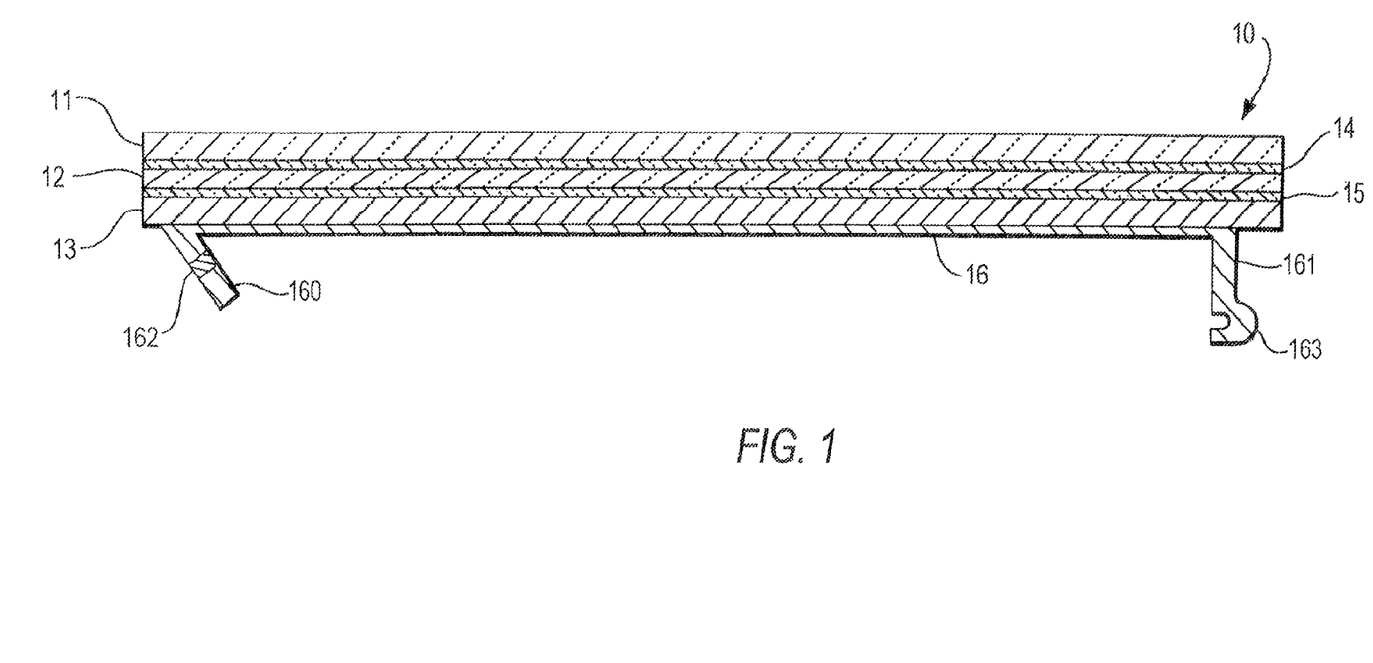
FIG. 1 is a cross-sectional view of an embodiment of a display window assembly with which the present invention may be used.

One embodiment of a display window assembly 10 with which the present invention may be used is shown in FIG. 1. Display window assembly 10 includes a window layer 11, a touch-sensitive layer 12, and a display layer 13. Layers 11 and 12, and layers 12 and 13, may be bonded to one another by respective transparent bonding layers 14, 15. Window layer 11 preferably is made of glass, although it may be made from a plastic material, and particularly from a high-molecular-weight plastic material that has many of the desirable characteristics of glass, such as scratch resistance. Other scratch-resistant clear materials, such as sapphire or quartz crystal, also may be used.

Touch-sensitive layer 12 and display layer 13 may incorporate any suitable touch-sensitive and display technologies, respectively. For example, display layer 13 may be a liquid crystal display. Similarly, bonding layers 14, 15 maybe any suitable transparent adhesive or may, particularly in the case of bonding layer 14, be the result of thermal bonding.

A frame or support 16 may be affixed to display window assembly 10 beneath display layer 13. Frame or support 16 may be affixed to the underside of display layer 13, as by a suitable adhesive (not shown), or may be formed (not shown) around the edges of display window assembly 10 or around the edges of one or more of its layers 11, 12, 13. Frame or support 16 may be made from any suitable metallic or polymeric material, but preferably is metallic (e.g., stainless steel). One or more tabs 160, 161 preferably extend in a direction away from window layer 11. In the embodiment shown, tab 160 is at an oblique angle to the viewing surface or major plane of display window assembly 10, while tab 161 is closer to perpendicular. However, as discussed below, other tab orientations may be possible. Tab 160 has a threaded hole 162 therein, while in this embodiment tab 161 has a hook 163 at its distal end.

Figure 2:
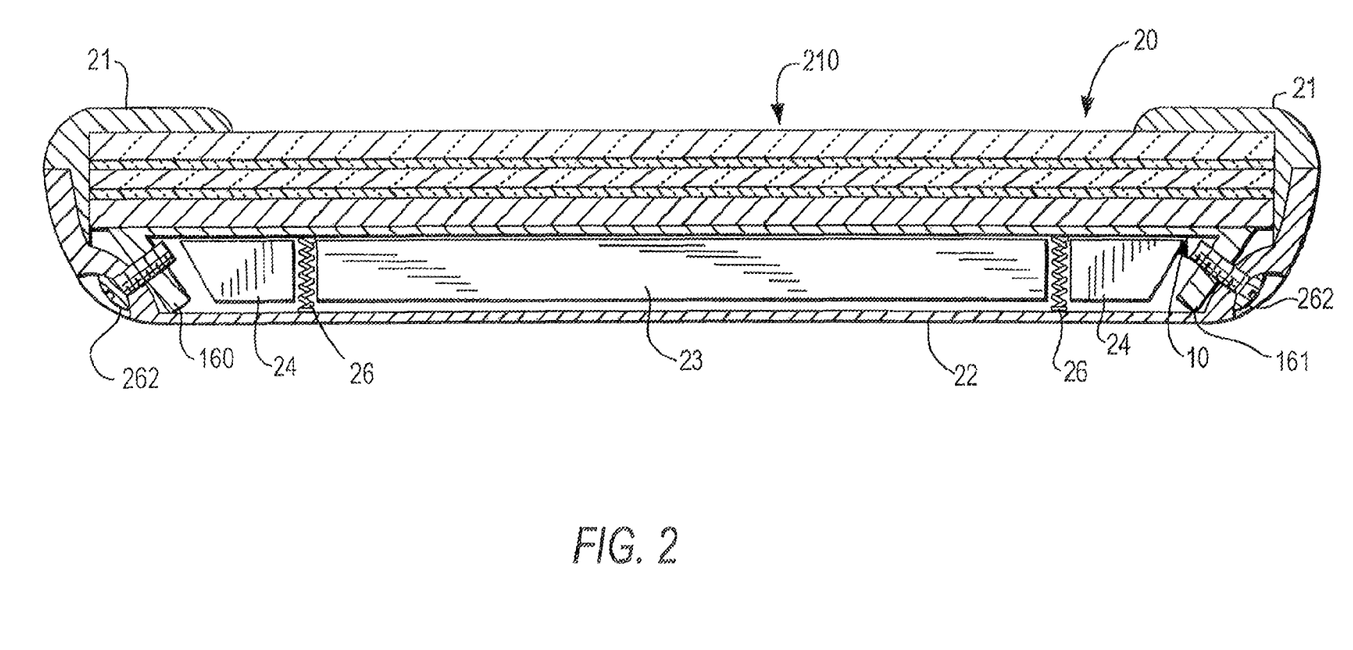
FIG. 2 is a cross-sectional view, of an exemplary device incorporating the display window assembly of FIG. 1.

Display window assembly 10 may be incorporated in a device 20 shown in FIG. 2. As can be seen, device 20 includes a bezel 21 having a window opening 210 into which display window assembly 10 is mounted, as well as rear or lower housing 22 to which bezel 21 is attached by any suitable attachment method (not shown). Housing 22 houses functional component or components 23, as well as body mass or masses 24. Resilient element or elements 26 urge display window assembly 10 outward of bezel 21, along a direction substantially orthogonal to the major plane of display window assembly 10 (i.e. within 15° of the orthogonal direction). Resilient element 26 could be a plastic or metallic spring, or alternatively could be a resilient mass such as a mass of closed-cell foam. In this embodiment, tab 161 extends at an angle symmetrical to that of tab 160 and both ends of display window assembly 10 are secured by fasteners or screws 262.

Because of the orientation of threaded hole 162—which in this embodiment is determined by the orientation of tab 160, 161, although tab 160, 161 could have a different orientation and threaded hole 162 could be formed at an oblique angle relative to tab 160, 161—advancement or withdrawal of fastener or screw 262 exerts a component of force orthogonal or normal to the major plane—i.e., the viewing face—of display window assembly 10, as well as a component of force parallel to the major plane of display window assembly 10. Display window assembly 10 is prevented from moving in the direction of the parallel components because the parallel component exerted by tab 160 is cancelled by the parallel component exerted by tab 161. However, display window assembly 10 may move in response to the normal component, and in combination with the opposing force exerted by resilient element 26, allows adjustment of the height of display window assembly 10. Thus, movement of each fastener or screw 262 in a direction other than the adjustment direction is converted into movement in the adjustment direction. This allows control of whether window layer 11 is flush with bezel 21, recessed in opening 210, or protruding from opening 210. In any event, the amount by which window layer 11 could be expected to be recessed or protruding, if not flush, is small.

Although in the embodiment of FIG. 2, tab 161 extends at an angle symmetrical to that of tab 160 and both ends of display window assembly 10 are secured by fasteners or screws 262, tab 161 could be oriented as shown in FIG. 1 and provided with hook 163 as shown there. In such an embodiment, similar that shown in FIG. 4, below, a boss 45 of housing 22 includes an aperture 451 with which hook 163 mates, securing the end of display window assembly 10 at the right side of FIG. 2. The end of display window assembly 10 at the left side of FIG. 2 would secured by a fastener such as screw 262, which mates with threaded hole 162, as previously discussed. The parallel force component of screw 262 in such an embodiment would be resisted by the interaction of hook 163 with aperture 251.

In the remaining embodiments described below in FIGS. 3-8, movement of the fastener in a direction with substantially no component in the adjustment direction is converted into movement of the display window assembly in the adjustment direction.

Figure 3:
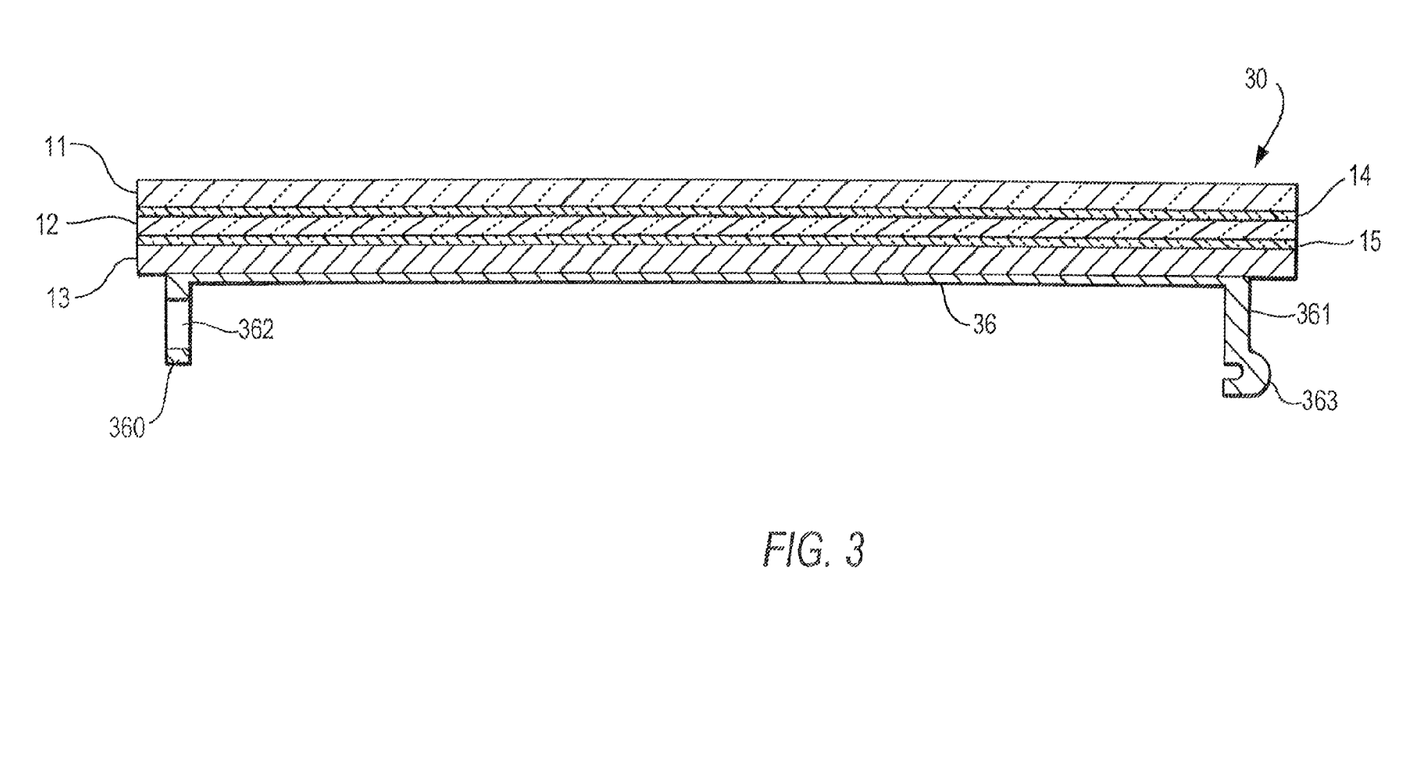
FIG. 3 is a cross-sectional view, similar to FIG. 1, of another embodiment of a display window assembly with which the present invention may be used.

Another embodiment of a display window assembly 30 with which the present invention may be used is shown in FIG. 3. Display window assembly 30 may include the same window layer 11, touch-sensitive layer 12, and display layer 13, as well as bonding layers 14 and 15, as in display window assembly 10.

A frame or support 36 may be affixed to display window assembly 30 beneath display layer 13. Frame or support 36 may be similar to frame or support 16, and may be affixed to the underside of display layer 13, as by a suitable adhesive (not shown), or may be formed around the edges of display window assembly 30 or around the edges of one or more of its layers 11, 12, 13. Frame or support 36 may be made from any suitable metallic or polymeric material, but preferably is metallic (e.g., stainless steel). One or more tabs 360, 361 preferably extend in a direction away from window layer 11. In these embodiments, however, tabs 360, 361 may be substantially perpendicular or normal (i.e., within 15° of normal) to the viewing surface or major plane of display window assembly 30. However, other tab orientations may be possible. Tab 360 has an elongated hole 362 therein, while in some embodiments tab 361 has a hook 363 at its distal end.

Figure 4:
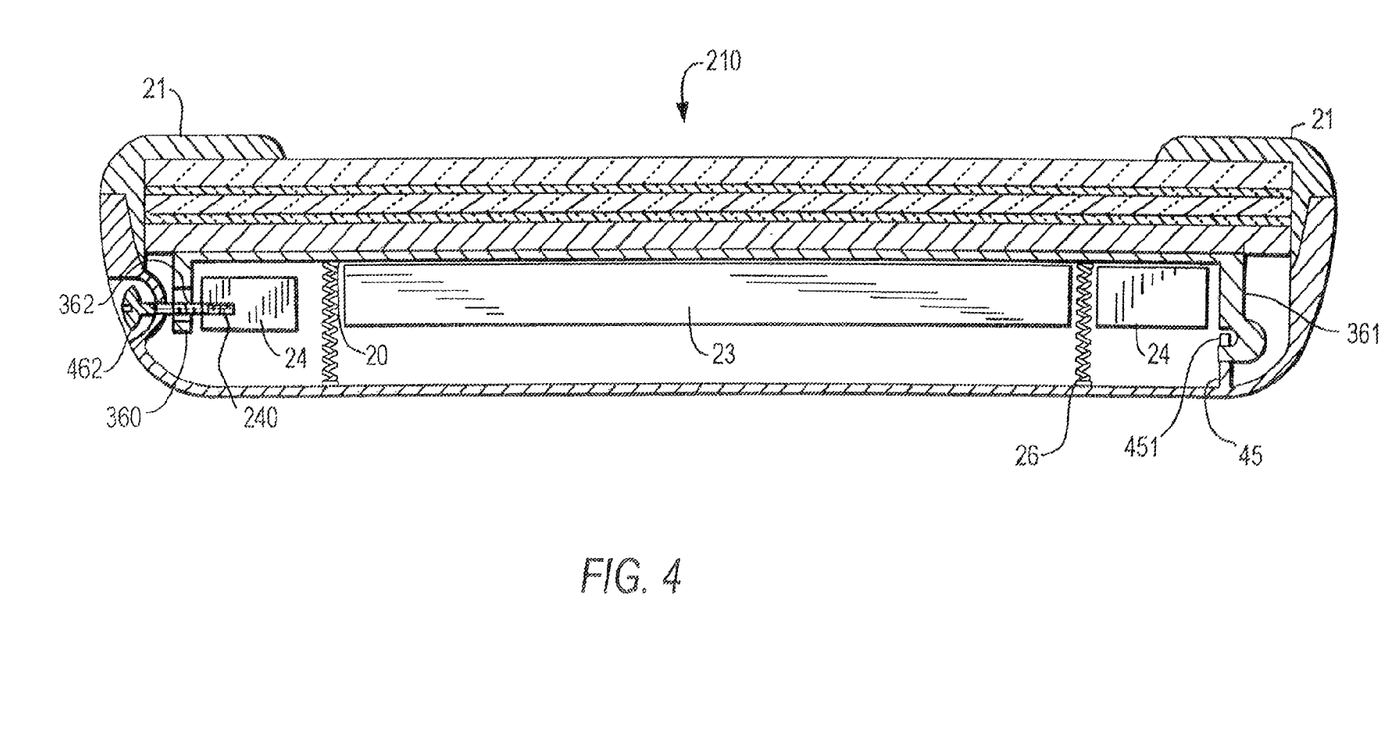
FIG. 4 is a cross-sectional view, similar to FIG. 2, of an exemplary device incorporating the display window assembly of FIG. 3.

Display window assembly 30 may be incorporated in a device 40 shown in FIG. 4. Like device 20, device 40 includes a bezel 21 having a window opening 210 into which display window assembly 10 is mounted, as well as rear or lower housing 22 to which bezel 21 is attached by any suitable attachment method (not shown). Housing 22 houses functional component or components 23, as well as body mass or masses 24. In these embodiments, the end of display window assembly 30 at the left side of FIG. 4 is secured by a fastener such as screw 462, which passes through elongated hole 362 and mates with threaded hole 240 in mass 24. However, the end of display window assembly 30 at the right side of FIG. 4 is secured by interaction of hook 363 with aperture 451 of a boss 45 of housing 22. Resilient element or elements 26 urge display window assembly 30 outward of bezel 21, along a direction substantially orthogonal to the major plane of display window assembly 30. Resilient element 26 could be a plastic or metallic spring, or alternatively could be a resilient mass such as a mass of closed-cell foam.

Threaded hole 240 is aligned so that screw or fastener 462 passes through elongated hole 362 offset from the center— i.e., closer to the distal end of elongated hole 362, for reasons explained below.

Figure 5:
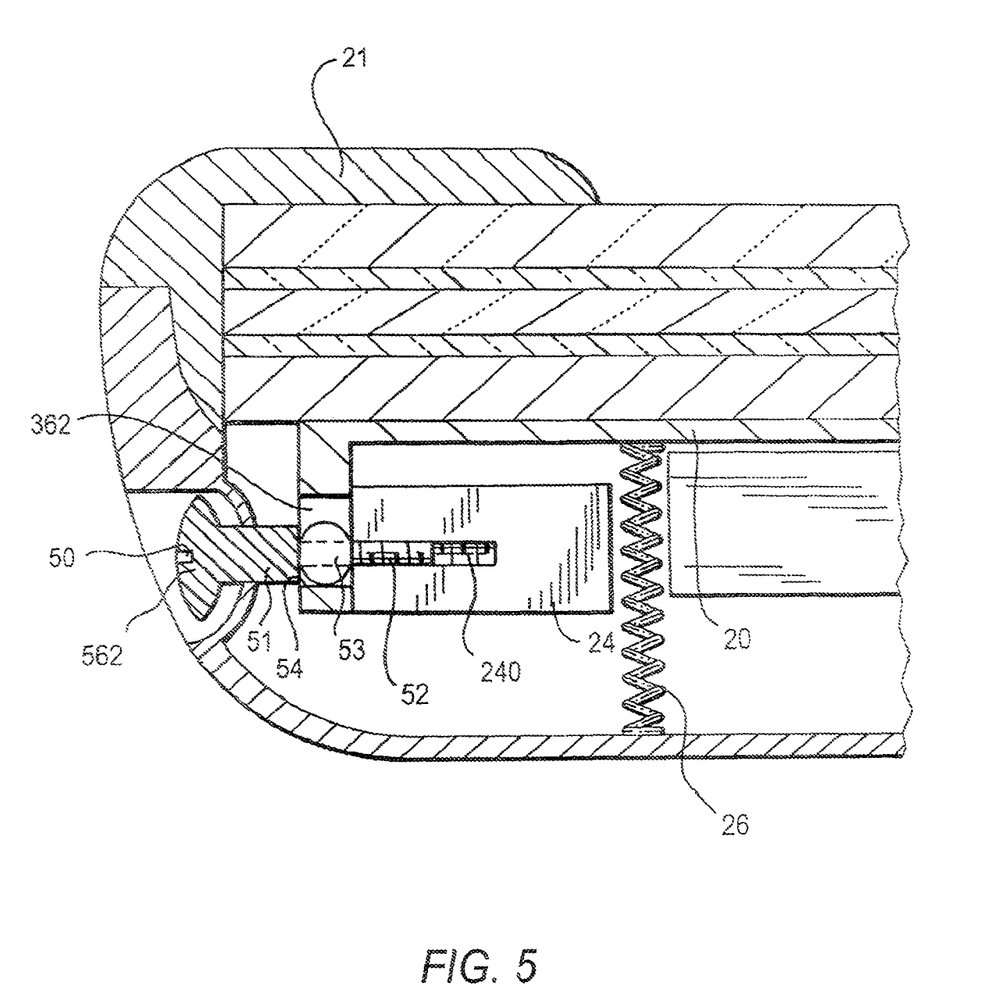
FIG. 5 is a fragmentary cross-sectional view of the device of FIG. 4 showing another embodiment of the present invention.

In the embodiment of FIG. 5, screw or fastener 562 has a shoulder 51 adjacent its head 50, followed by threaded shaft 52. An elastomeric mass 53 is mounted on threaded shaft 52 adjacent shoulder 51. Note that if head 50 is countersunk as discussed below, it may be possible to eliminate shoulder 51. The length of shoulder 51 is such that elastomeric mass 53 sits inside elongated hole 362, while the widths of elastomeric mass 53 and elongated hole 362 are such that elastomeric mass 53 in its uncompressed condition does not interfere with the edges of elongated hole 362.

As screw or fastener 562 is tightened or advanced, elastomeric mass 53 is deformed between shoulder 51 (or head 50 if there is no shoulder 51) and body mass 24. The expansion of elastomeric mass 53 radially outwardly of shaft 52—i.e., in the adjustment direction of display window assembly 30—causes it to contact distal edge 54 of elongated hole 362 at which point further tightening results in further deformation, pushing on distal edge 54 to move display window assembly 30 downward in the adjustment direction. Because of the aforementioned offset, there is no upward force on the proximal edge of elongated hole 362. Loosening or withdrawal of screw or fastener 562 allows elastomeric mass 53 to relax, reversing the motion of display window assembly 30 under the influence of resilient element 26.

Figure 6:
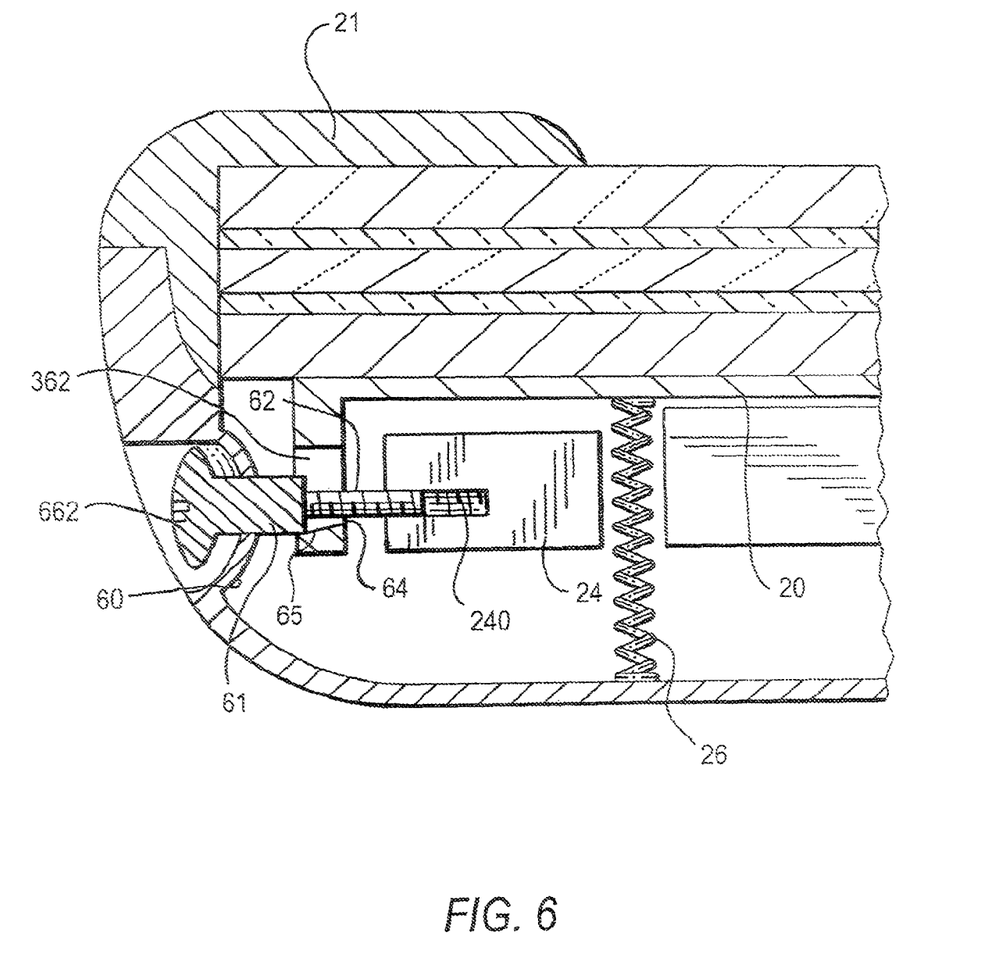
FIG. 6 is a fragmentary cross-sectional view of the device of FIG. 4 showing another embodiment of the present invention.

In the embodiment of FIG. 6, screw or fastener 662 has a shoulder 61 adjacent its head 60, followed by threaded shaft 62. Unlike the embodiment of FIG. 5, in this embodiment, even if head 60 is countersunk as discussed below, some shoulder 61 is still required. The length of shoulder 61 is such that it contacts distal edge 64 of elongated hole 362, which in this embodiment is chamfered to form a cam surface 65. As screw or fastener 662 is tightened or advanced, shoulder 61 rides onto cam surface 65, acting as a cam follower that pushes on distal edge 64 to move display window assembly 30 downward in the adjustment direction. Loosening or withdrawal of screw or fastener 662 reverses the motion of display window assembly 30 under the influence of resilient element 26.

Figure 7:
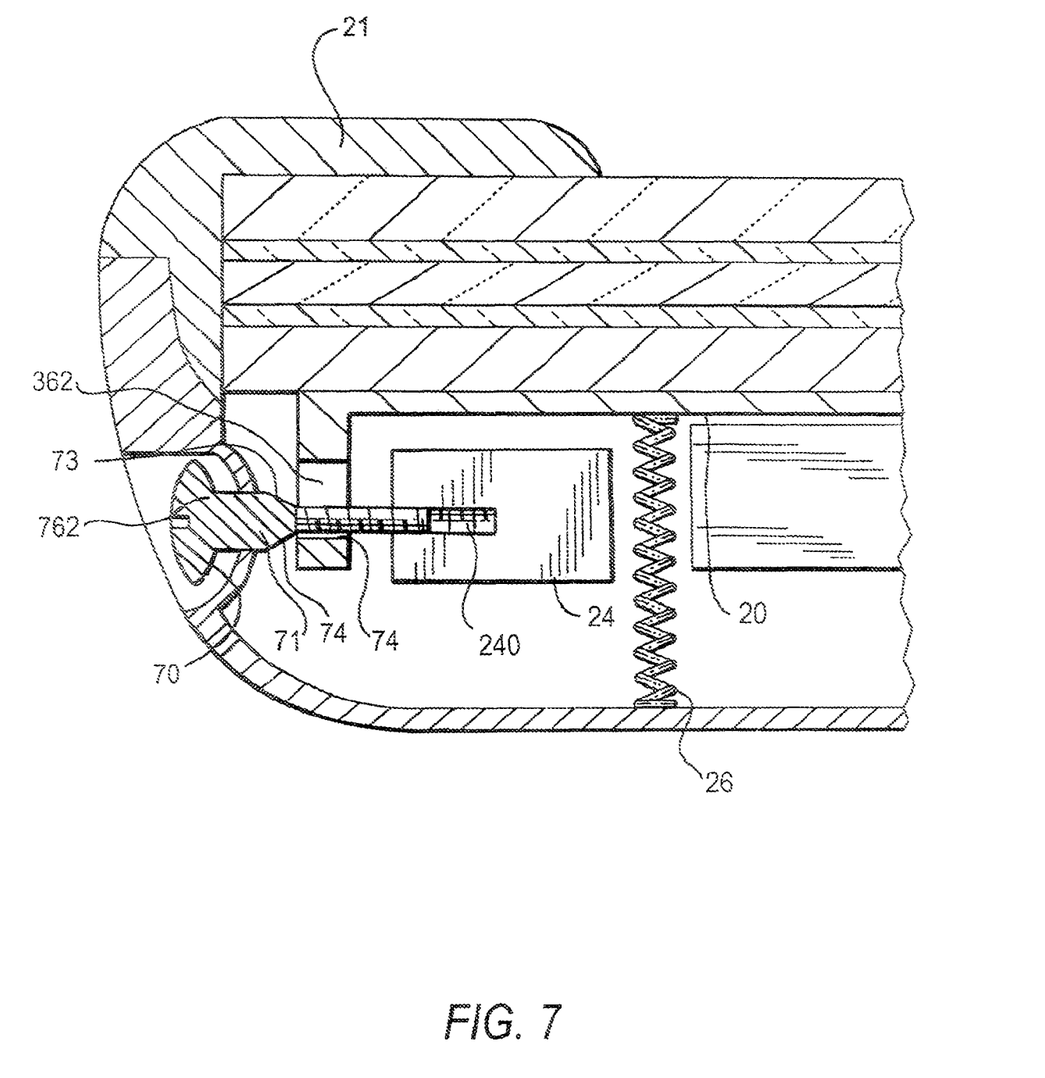
FIG. 7 is a fragmentary cross-sectional view of the device of FIG. 4 showing another embodiment of the present invention.

In the embodiment of FIG. 7, screw or fastener 762 has a shoulder 71 adjacent its head 70, followed by threaded shaft 72. Shoulder 71 has a conical surface 73 adjacent shaft 72. In this embodiment also, even if head 70 is countersunk as discussed below, some shoulder 71—sufficient to support conical surface 73—is still required. The length of shoulder 71 is such that distal edge 74 of elongated hole 362 contacts conical surface 73, which acts as a cam surface. As screw or fastener 762 is tightened or advanced, shoulder 71 rides onto distal edge 74, which acts as a cam follower to push display window assembly 30 downward in the adjustment direction. Loosening or withdrawal of screw or fastener 762 reverses the motion of display window assembly 30 under the influence of resilient element 26.

Figure 8:
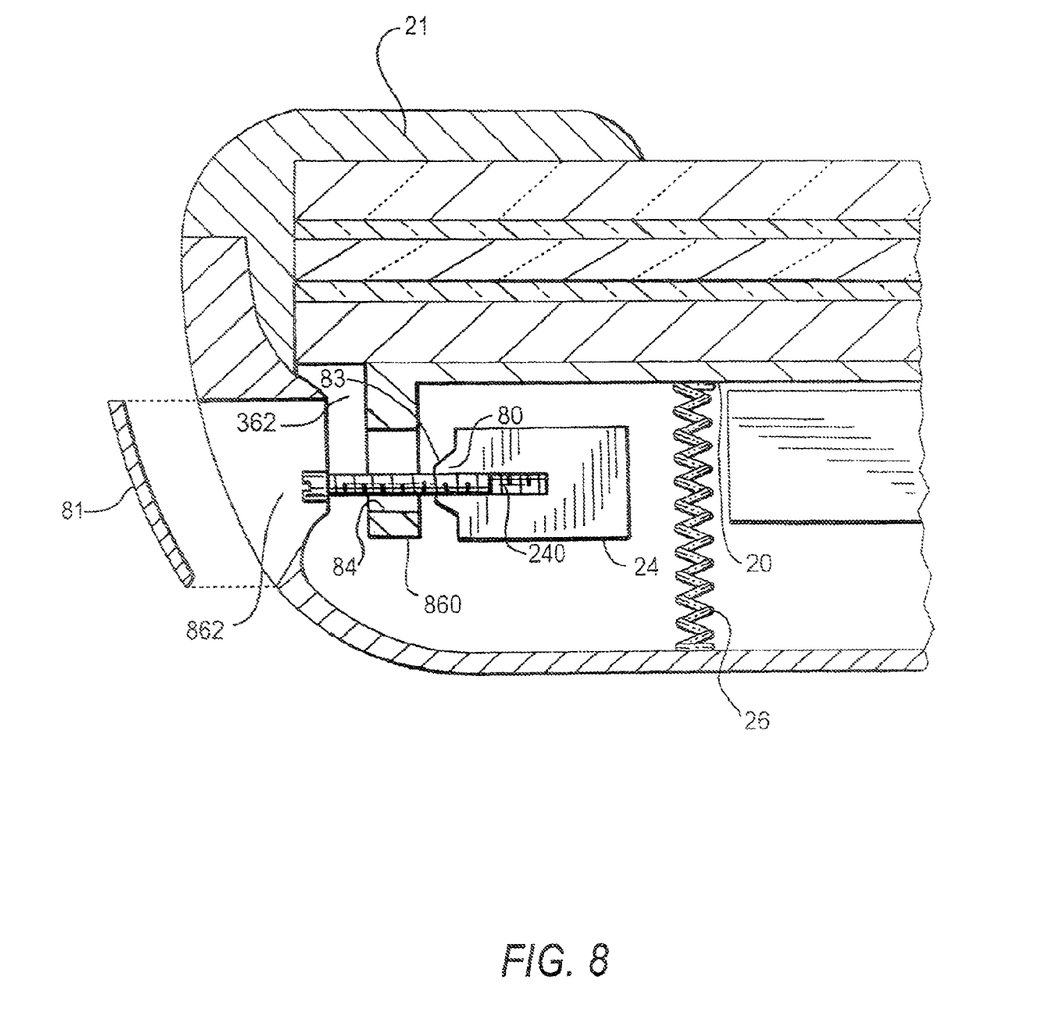
FIG. 8 is a fragmentary cross-sectional view of the device of FIG. 5 showing another embodiment of the present invention.

In the embodiment of FIG. 8, screw or fastener 862 need not have a shoulder or even a head, and in the drawing is shown as a set screw, although it also may have a head. In this embodiment, body mass 24 is free to move substantially parallel (i.e., within 15° of parallel) to the display surface of display layer 11 (note that this may be true in any of the foregoing embodiments as well), and has a frustoconical nipple 80 with threaded hole 240 in the top of nipple 80.

As screw or fastener 862 is tightened or advanced, body mass 24 moves closer to tab 860. Nipple 80 begins to protrude into elongated hole 362 and the side 83 of nipple 80 contacts distal edge 84 of elongated hole 362. The side 83 of nipple 80 acts as a cam surface, while distal edge 84 acts as a cam follower, to push display window assembly 30 downward in the adjustment direction. It will be noted that because nipple 80 does not rotate, it need not be frustoconical, and that instead of a conical side surface 83, the side of nipple 80 facing distal edge 84 may be chamfered (not shown). Loosening or withdrawal of screw or fastener 862 reverses the motion of display window assembly 30 under the influence of resilient element 26.

As stated above, screw or fastener 862 is shown in FIG. 8 as a set screw. Although set screw 862 is set in a side of device 40 that does not normally face the user, it may be desirable for aesthetic reasons to present a smooth overall surface. Therefore, removable cap or cover panel 81 may be provided to cover the hole 82 in which set screw 862 is countersunk.

The same aesthetic considerations may apply to the other embodiments shown above. Therefore, where a screw or fastener has a head, the head may be made with an aesthetically pleasing appearance. For example it may be given a curvature and surface finish to match that of lower housing 22. However, the screw must still have a screwdriver slot or slots, and adjustment of the display window assembly may result in even the most aesthetically pleasing screw head being above or below the surface of housing 22, rather than flush with that surface. Therefore, any of the embodiments shown may have a removable cap or cover plate as in FIG. 8.

Although in the embodiments of FIGS. 3-8 only one tab 360/860 of each display window assembly according to the invention is used to adjust the display window assembly, while any other tab 361/861 simply holds down another portion of the display window assembly, it is possible for two or more tabs to be used for adjusting the display window assembly, as in the embodiment of FIG. 2.

Similarly, although tabs 160/360/860 have been shown with a particular orientation relative to the display window assembly, with each fastener or screw 162/362/862 extending substantially perpendicularly through the tab 160/360/860, other orientations of tab 160/360/860 may be provided as long as the orientation of fastener or screw 162/362/862 is maintained. Thus, the fastener or screw need not be substantially perpendicular (i.e., within 15° of perpendicular) to the tab, meaning that, in the case of a tab with a threaded hole, the threaded hole will not be perpendicular to the major plane of the tab.

Thus it is seen that an adjustable display window, where the adjustment in an adjustment direction is initiated by movement of an adjustment element in a different direction, enabling an aesthetic surface to be presented to a user, has been provided. It will be understood that the foregoing is only illustrative of the principles of the invention, and that various modifications can be made by those skilled in the art without departing from the scope and spirit of the invention, and the present invention is limited only by the claims that follow.

What is claimed is:

1. A device comprising:
   a housing; and
   a component mounted in said housing; wherein:
   said component has a first depending tab at a first end thereof and a second depending tab at a second end thereof;
   said first depending tab has a hook thereon;
   said housing has an aperture therein; and
   said hook engages said aperture;
   said device further comprising:
   a fastener extending into said housing through a fastener opening in said housing and through said second depending tab; and
   an adjustment element that interacts with said fastener; wherein:
   adjustment of said fastener in a first adjustment direction moves said component in a first direction of motion relative to said housing; and
   adjustment of said fastener in a second adjustment direction moves said component in a second direction of motion relative to said housing opposite to said first direction of motion relative to said housing.

2. The device of claim 1 wherein:
   said fastener is a screw.

3. The device of claim 1 wherein:
   said housing comprises a boss adjacent said first depending tab; and
   said aperture is located in said boss.

4. The device of claim 1 wherein:
   said housing has a display opening therein;
   said component comprises a display window assembly mounted in said housing and having a display surface facing said display opening; and
   each of said first and second depending tabs extends from a side of said component facing away from said display surface.

5. The device of claim 4 further comprising a resilient element located in said housing urging said display window assembly in an outward direction toward said display opening.

6. The device of claim 5 wherein:
   said adjustment of said fastener in said first adjustment direction moves said display window assembly in said outward direction; and
   said adjustment of said fastener in said second adjustment direction moves said display window assembly in an inward direction opposite to said outward direction.

7. The device of claim 4 wherein:
   adjustment of said fastener in said first adjustment direction moves said display window assembly in an outward direction toward said display opening; and
   adjustment of said fastener in said second adjustment direction moves said display window assembly in an inward direction opposite to said outward direction.

8. A device comprising:
   a functional module; and
   a housing at most partially surrounding said functional module; wherein:
   said functional module has an integral first fastener portion;
   said housing has an integral second fastener portion; and
   said integral first fastener portion and said integral second fastener portion engage one another to partially retain said functional module in said housing; said device further comprising:
   a removable fastener inserted from outside said housing into said functional module to adjustably retain said electronic module in said housing; and
   an adjustment element that interacts with said removable fastener; wherein:
   adjustment of said removable fastener in a first adjustment direction causes said adjustment element to move said functional module in a first direction of motion relative to said housing; and adjustment of said removable fastener in a second adjustment direction causes said adjustment element to move said functional module in a second direction of motion relative to said housing.

9. The device of claim 8 wherein:

said an integral first fastener portion comprises a hook; and said integral second fastener portion comprises a boss having an aperture therein.

10. The device of claim 8 wherein:

said functional module comprises a display having a display surface; and said housing surrounds said functional module other than at said display surface, said housing having an opening therein to reveal said display surface.

11. The device of claim 10 further comprising a resilient element located in said housing urging said functional module in an outward direction toward said opening.

12. The device of claim 11 wherein:

said adjustment of said removable fastener in said first adjustment direction causes said adjustment element to move said functional module in said outward direction; and said adjustment of said removable fastener in said second adjustment direction causes said adjustment element to move said functional module in an inward direction opposite to said outward direction.

13. The device of claim 8 wherein:

said housing has an opening therein, said housing surrounding said functional module other than at said opening;

adjustment of said removable fastener in said first adjustment direction causes said adjustment element to move said functional module in an outward direction toward said opening; and adjustment of said removable fastener in said second adjustment direction causes said adjustment element to move said functional module in an inward direction opposite to said outward direction.

14. A device comprising:

a housing;

a component within said housing;

an attachment between said housing and said component about which said component is rotatable; and an adjustment member extending through said housing into said component; wherein:

adjustment of said adjustment member in a first adjustment direction moves said component in a first direction of motion relative to said housing; and adjustment of said adjustment member in a second adjustment direction moves said component in a second direction of motion relative to said housing opposite to said first direction of motion relative to said housing.

15. The device of claim 14 wherein said attachment comprises:

a first attachment portion on said component; and second attachment portion on said housing; wherein:

said first attachment portion and said second attachment portion engage each other rotatably.

16. The device of claim 15 wherein:

said first attachment portion comprises a hook; and said second attachment portion comprises a boss having an aperture therein.

17. The device of claim 14 wherein:

said housing has an outer surface and an opening therein;

said component comprises a display; and said display is located in said opening and forms a portion of said outer surface.

18. The device of claim 14 wherein:

said housing has an opening therein; said device further comprising:

a resilient element located in said housing urging said component in an outward direction toward said opening.

19. The device of claim 18 further comprising an adjustment element that interacts with said adjustment member; wherein:

said adjustment of said adjustment member in said first adjustment direction moves said component in said outward direction; and said adjustment of said adjustment member in said second adjustment direction moves said component in an inward direction opposite to said outward direction.

20. The device of claim 14 wherein said adjustment member is a removable fastener.

* * * * *